(12) United States Patent
Pei et al.

(10) Patent No.: US 6,322,385 B1
(45) Date of Patent: Nov. 27, 2001

(54) BALL GRID ARRAY ZERO INSERTION FORCE SOCKET

(75) Inventors: Wen-Chun Pei, Taipei; Ming-Lun Szu, Taiepi, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/454,678

(22) Filed: Dec. 3, 1999

(51) Int. Cl.[7] .................................................. H01R 13/502
(52) U.S. Cl. .......................................... 439/342; 439/701
(58) Field of Search ................................... 439/259, 263, 439/266, 342, 567, 701

(56) References Cited

U.S. PATENT DOCUMENTS 6,062,890 * 5/2000 Pei et al. ............................... 439/342
6,077,099 * 6/2000 Pei et al. ............................... 439/263

* cited by examiner

*Primary Examiner*—Khiem Nguyen
(74) *Attorney, Agent, or Firm*—Wei Te Chung

(57) ABSTRACT

A socket comprises a first base having a plurality of solder balls attached to a bottom thereof and a second base. A cam lever is rotatably received in the second base and has a handle portion extending to exterior of the second base for operation of the cam lever. A cover is slidably mounted on the first base and the second base and fixes the first base and the second base in a juxtaposed relation.

15 Claims, 3 Drawing Sheets

BALL GRID ARRAY ZERO INSERTION FORCE SOCKET

BACKGROUND OF THE INVENTION

1. Field of the Invention

The present invention relates to a ball grid array zero insertion force socket for a CPU package, especially a socket having two pieces of bases, one for mounting solder balls thereon, and the other for receiving a cam lever to move a cover which is movably mounted on the bases.

2. The Related Art

Ball grid array zero insertion force (ZIF) sockets are usually installed with a cam lever for controlling insertion/withdrawal of a CPU package. For achieving low profile requirement, the cam lever is normally operated in a horizontal manner. Therefore, the cam lever is particularly received in a lever reception area which is adjacent to and not overlapped with a contact reception area to a bottom of which solder balls are mounted. However, solder balls mounted on the bottom of the contact reception area can not be soldered on a printed circuit board coplanarly due to the weight of the lever reception area. For example, FIG. 4 illustrates a socket 1 having a cover 11 moveably engaged with a base 12 and a cam lever 3 pivotably received between the cover 11 and the base 12 and operative to move the cover 11 in opposite directions for respectively rendering the socket into a loosened status for receiving CPU pins with substantially zero insertion force or into a tightened status for engaging the inserted CPU pins with contacts retained in the base 12. The details of this socket may be referred to U.S. patent application Ser. No. 09/128,769, which is assigned to the same assignee of the present application and enclosed herein for reference. The socket 1 has a plurality of solder balls 8 mounted to a bottom of a contact reception area 1A which is adjacent to a lever reception area 1B. The socket is electrically connected to a printed circuit board 9 via a reflow soldering procedure on the solder balls 8. Since another half bottom portion of the socket 1 has no solder balls mounted thereto, some of the solder balls are apt to be cold soldered to the printed circuit board due to the unbalanced weight of the lever reception area.

It is requisite to provide a new ZIF socket which can solve the soldering problem as encountered in FIG. 4.

SUMMARY OF THE INVENTION

The primary purpose of the present invention is to provide a zero insertion force socket which can be soldered onto a printed circuit board effectively regardless of the unbalanced weight of a lever reception area thereof.

In accordance with one aspect of the present invention, a socket comprises a first base having a plurality of solder balls attached to a bottom thereof and a second base. A cam lever is rotatably received in the second base and has a handle portion extending to exterior of the second base for operation of the cam lever. A cover is slidably mounted on the first base and the second base and fixes the first base and the second base in a juxtaposed relation.

In accordance with another aspect of the present invention, a socket assembly comprises a first base having a plurality of solder balls attached to a bottom thereof which are surface mounted to a printed circuit board. A second base is fixed to the printed circuit board and juxtaposed with the first base. A cam lever is rotatably received in the second base and has a handle portion extending to exterior of the second base for operation of the cam lever. A cover is mounted on the first base and the second base and slidable over the first base and the second base via operation of the cam lever.

DETAILED DESCRIPTION OF THE PREFERRED EMBODIMENT

Figure 1:
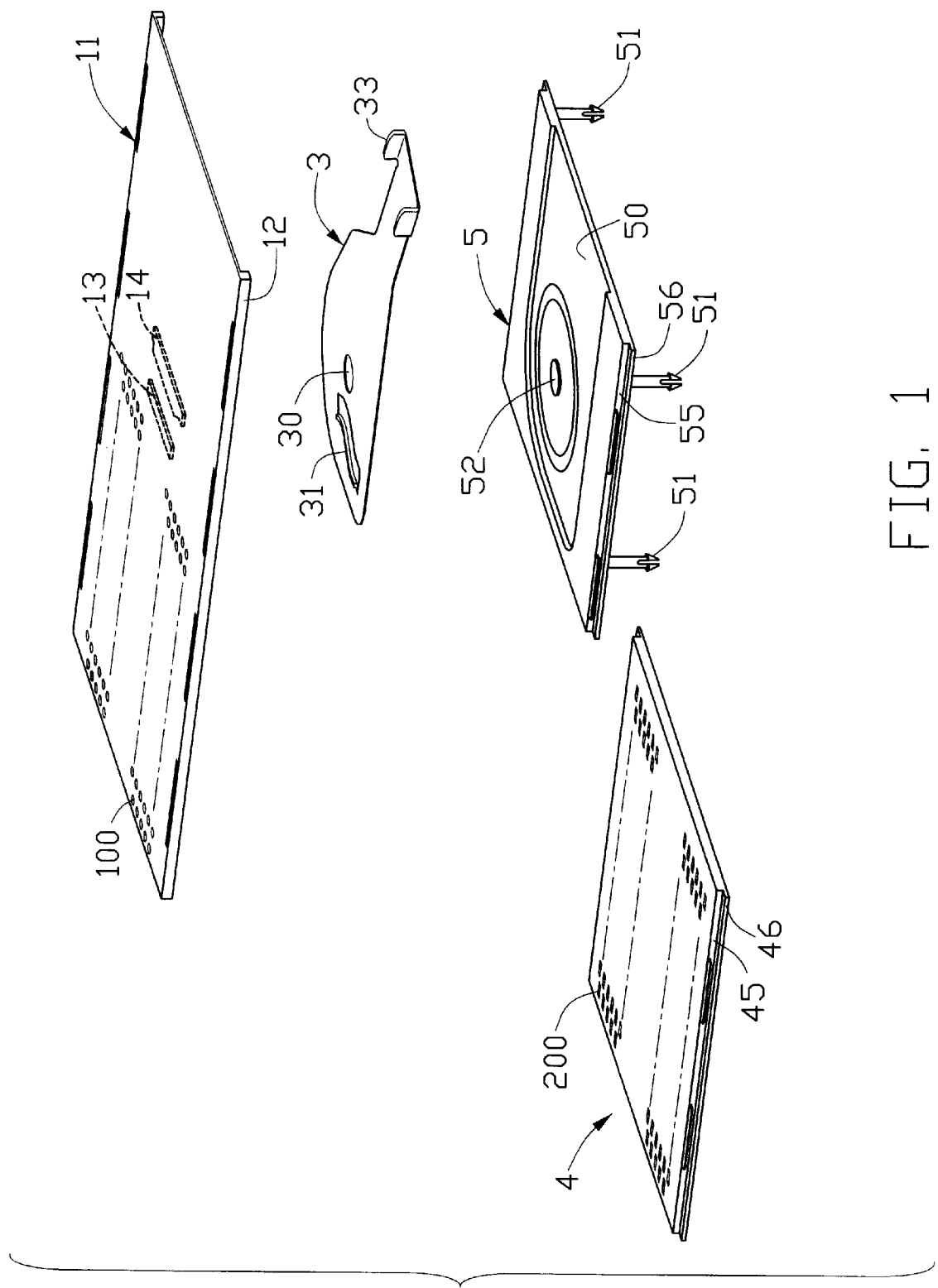
FIG. 1 is an exploded view of a socket in accordance with the present invention.

Referring to FIG. 1, a ZIF socket in accordance with the present invention comprises a first base 4, a second base 5, a cam lever 3 rotatably fixed in the second base 5, and a cover 11 slidably engaged with the first base 4 and the second base 5. The cover 11 is formed rectangular having two flanges 12 extending downward from longitudinal sides thereof. A plurality of holes 100 are defined in substantially a half portion of the cover 11. A first follower block 13 and a second follower block 14 extend downward from an inner surface of the cover 11 and both are spaced from each other with a predetermined distance. The cam lever 3 is made of metal material by stamping and bending having a driving tab 31 extending upward therefrom and a handle portion 33 at one end thereof for manual operation of the cam lever 3. A hole 30 is defined in the cam lever 3 near the driving tab 31.

The first base 4 is formed rectangular substantially mating with the half portion of the cover 11 which defines the holes 100 therein. Two flanges 46 extend from two vertical side walls 45 of the first base 4 and a plurality of passageways 200 are defined in the first base 4 retaining contacts (not shown) therein. The second base 5 is also formed rectangular substantially mating with the other half portion of the cover 11. The second base 5 has a recess 50 defined therein for rotatably receiving the cam lever 3. A pivot 52 projects upward from a bottom of the recess 50 for rotatably engaging with the hole 30 of the cam lever 3. Two flanges 56 horizontally extend from two vertical side walls 55 of the second base 5. Four board locks 51 extend downward from the second base 5.

Figure 2:
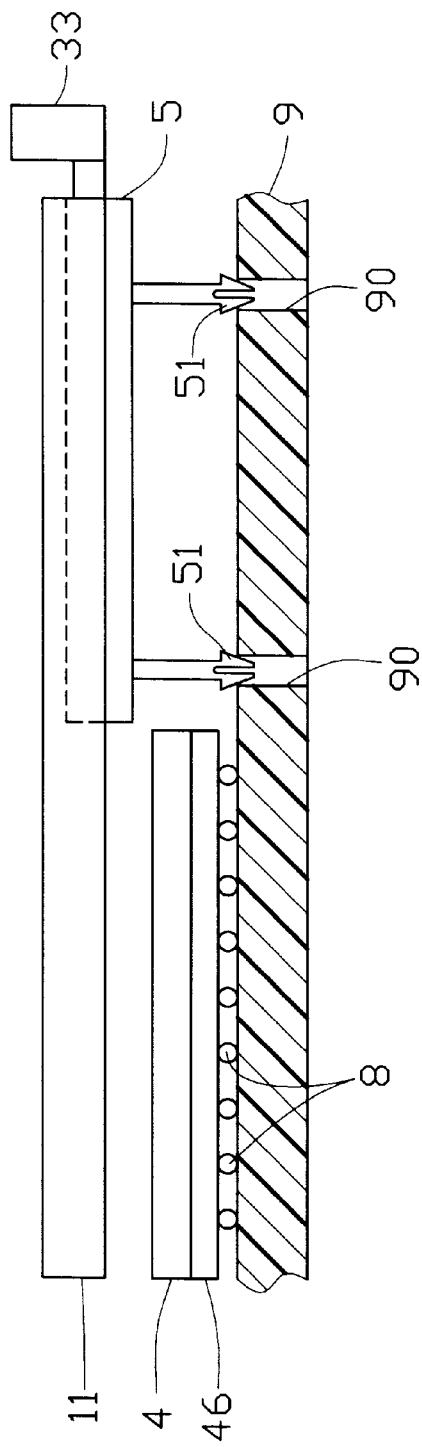
FIG. 2 is a schematic view showing that the first base of FIG. 1 has been soldered onto a printed circuit board and the second base assembled with the lever and the cover is being configured with printed circuit board.

Referring to FIG. 2, the first base 4 is surface mounted to to a printed circuit board 9 via a plurality of solder balls 8 which have been in advance soldered to the contacts (not shown) of the first base 4. The solder balls 8 can be surface mounted on the printed circuit board 9 coplanarly and effectively without interference originated from any unbalanced weight loaded on the first base 4. The cover 11 is mounted onto the second base 5 which has in advance positioned the cam lever 3 therein. The second base 5 after assembled with the cover 11 is then mounted onto the printed circuit board 9, with the board locks 51 thereof being engaged within holes 90 which are defined in the printed circuit board 9. When the second base 5 is mounted onto the printed circuit board 9, the cover 11 which has a half portion engaging with the second base 5 is also engaged with the first base 4, with the flanges 12 thereof being engaged with the vertical side walls 45, 55 of the first base 4 and the second base 5.

Figure 3:
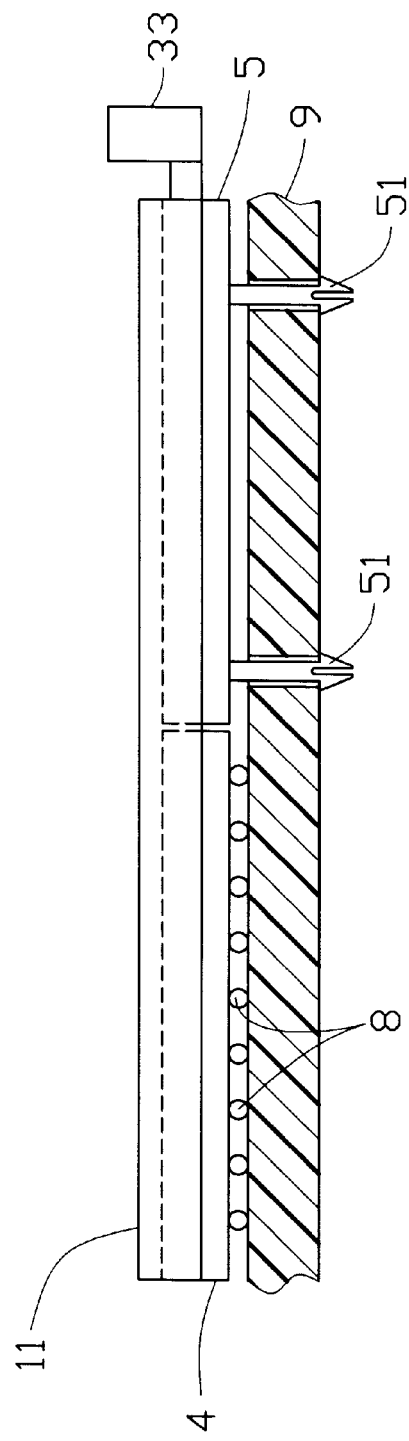
FIG. 3 is a schematic view showing that the first and second bases are firmly mounted on the printed circuit board.
Figure 4:
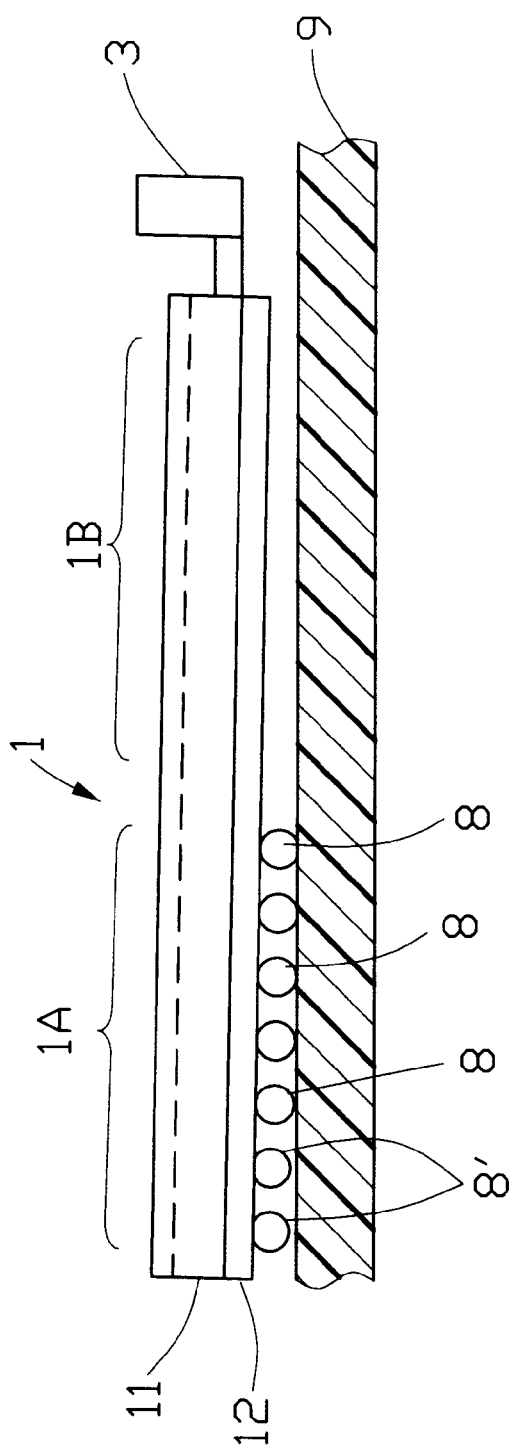
FIG. 4 is a schematic view of related art of a socket mounted on a printed circuit board with cold soldering problem.

The final assembly is shown in FIG. 3, wherein each hole 100 of the cover 11 substantially registers with a corresponding one of the passageway 200 of the first base 4. The first base 4 is juxtaposed with the second base 5 and both of them are engaged with the cover 11 which is slidable over the juxtaposed bases 4 and 5.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A socket comprising
    a first base having a plurality of solder balls attached to a bottom thereof;
    a second base;
    a cam lever rotatably received in the second base and having a handle portion extending to the exterior of the second base for operation of the cam lever; and
    a cover slidably and vertically mounted on the first base and the second base and fixing the first base and the second base in a horizontally juxtaposed relation.

2. The socket as claimed in claim 1, wherein the first base has a flange horizontally extending from one side thereof.

3. The socket as claimed in claim 1, wherein the second base has a flange horizontally extending from one side thereof.

4. The socket as claimed in claim 1, wherein the second base has a board lock extending downwardly from a bottom thereof.

5. The socket as claimed in claim 1, wherein the second base has a recess for positioning the cam lever therein.

6. The socket as claimed in claim 1, wherein the cover has flanges extending downward from two sides thereof.

7. A socket assembly comprising
    a first base having a plurality of solder balls attached to a bottom thereof which are surface mounted to a printed circuit board;
    a second base vertically and directly fixed to the printed circuit board and horizontally juxtaposed with the first base;
    a cam lever rotatably received in the second base and having a handle portion extending to the exterior of the second base for operation of the cam lever; and
    a cover mounted on the first base and the second base and slidable over the first base and the second base via operation of the cam lever.

8. The socket assembly as claimed in claim 7, wherein the first base has a flange horizontally extending from one side thereof.

9. The socket assembly as claimed in claim 7, wherein the second base has a flange horizontally extending from one side thereof.

10. The socket assembly as claimed in claim 7, wherein the second base has a board lock extending downwardly from a bottom thereof for engaging with a hole defined in the printed circuit board.

11. The socket assembly as claimed in claim 7, wherein the second base has a recess for positioning the cam lever therein.

12. The socket assembly as claimed in claim 7, wherein the cover has flanges extending downward from two sides thereof.

13. A socket assembly comprising:
    first and second bases side by side individually secured to a mother board;
    a plurality of passageways defined in the first base for receiving pins of a CPU therein;
    cam mechanism positioned around the second base; and
    a cover dimensioned to shield both the first and second bases, said cover respectively latchably engaged with both the first and the second bases in a vertical direction; wherein
    the cover slides upon both the first and second bases in a longitudinal direction thereof by actuation of the cam mechanism.

14. The socket assembly as claimed in claim 13, wherein said cam mechanism is sandwiched between the cover and the second base.

15. A socket comprising
    a first base having a plurality of solder balls attached to a bottom thereof;
    a second base;
    a cam lever rotatably received in the second base and having a handle portion extending to the exterior of the second base for operation of the cam lever; and a cover slidably mounted on the first base and the second base and fixing the first base and the second base in a juxtaposed relation; wherein
    the second base has a board lock extending downwardly from a bottom thereof.

* * * * *